(12) United States Patent
Kim et al.

(10) Patent No.: US 9,736,937 B2
(45) Date of Patent: Aug. 15, 2017

(54) CONDUCTIVE FILM, METHOD FOR MANUFACTURING THE SAME AND DISPLAY DEVICE COMPRISING THE SAME

(71) Applicant: LG CHEM, LTD., Seoul (KR)

(72) Inventors: Yong Chan Kim, Daejeon (KR); Jin Hyong Lim, Daejeon (KR); Ki-Hwan Kim, Daejeon (KR); Junghwan Yoon, Daejeon (KR); Ilha Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 238 days.

(21) Appl. No.: 14/443,213

(22) PCT Filed: Oct. 30, 2014

(86) PCT No.: PCT/KR2014/010280
§ 371 (c)(1),
(2) Date: May 15, 2015

(87) PCT Pub. No.: WO2015/065055
PCT Pub. Date: May 7, 2015

(65) Prior Publication Data
US 2015/0313013 A1    Oct. 29, 2015

(30) Foreign Application Priority Data
Oct. 30, 2013 (KR) .................. 10-2013-0129992

(51) Int. Cl.
*H01L 31/00* (2006.01)
*H05K 1/09* (2006.01)
(Continued)

(52) U.S. Cl.
CPC ............. *H05K 1/09* (2013.01); *G06F 1/16* (2013.01); *G06F 3/041* (2013.01); *H01B 1/026* (2013.01); *H01L 31/022433* (2013.01); *H01L 31/022475* (2013.01); *H01L 31/022483* (2013.01); *H01L 31/1884* (2013.01); *H05K 1/0298* (2013.01); *H05K 5/0017* (2013.01);
(Continued)

(58) Field of Classification Search
CPC .............. H01L 31/022466; H01B 7/04; G02F 1/13439; B82Y 10/00
USPC ........ 136/256; 349/147; 428/469; 360/324.1
See application file for complete search history.

(56) References Cited

U.S. PATENT DOCUMENTS 6,219,125 B1 * 4/2001 Ishikura ............. G02F 1/13439
349/147
2005/0271796 A1   12/2005  Neudecker et al.
(Continued)

FOREIGN PATENT DOCUMENTS

JP      2011-060146 A     3/2011
JP      2013-129183 A     7/2013
(Continued)

OTHER PUBLICATIONS

Wang, J., et al., "Copper nitide (CU3N) thing films deposited by RF magnetron sputtering," Journal of Crystal Growth, 286, 2006, pp. 407-412.
(Continued)

*Primary Examiner* — Khanh Tuan Nguyen
(74) *Attorney, Agent, or Firm* — Dentons US LLP

(57) ABSTRACT

The present application relates to a conductive film, a method for manufacturing the same, and a display device including the same.

25 Claims, 2 Drawing Sheets

(51) Int. Cl.
*G06F 3/041* (2006.01)
*H01L 31/18* (2006.01)
*G06F 1/16* (2006.01)
*H01L 31/0224* (2006.01)
*H05K 5/00* (2006.01)
*H01B 1/02* (2006.01)
*H05K 1/02* (2006.01)
*H05K 3/06* (2006.01)
*H01L 51/44* (2006.01)

(52) U.S. Cl.
CPC .......... *H01L 51/445* (2013.01); *H05K 1/0274* (2013.01); *H05K 3/06* (2013.01); *H05K 2201/0108* (2013.01); *H05K 2201/0338* (2013.01); *Y02E 10/50* (2013.01)

(56) References Cited

U.S. PATENT DOCUMENTS

| | | | | |
|---|---|---|---|---|
| 2008/0259507 A1* | 10/2008 | Lin | ........................ | B82Y 10/00 360/324.1 |
| 2012/0031872 A1* | 2/2012 | Sekiguchi | .............. | B82Y 10/00 216/13 |
| 2012/0073947 A1 | 3/2012 | Sakata et al. | | |
| 2013/0157070 A1* | 6/2013 | Fujino | ...................... | H01B 7/04 428/469 |
| 2013/0215067 A1* | 8/2013 | Hwang | .................. | G02B 5/003 345/173 |
| 2014/0016278 A1 | 1/2014 | Hwang et al. | | |
| 2014/0251429 A1* | 9/2014 | Lim | ................ | H01L 31/022466 136/256 |

FOREIGN PATENT DOCUMENTS

| | | |
|---|---|---|
| JP | 2013129067 A | 7/2013 |
| KR | 10-2010-0007605 A | 1/2010 |
| KR | 10-2012-0040680 A | 4/2012 |
| KR | 1020120110065 A | 10/2012 |
| KR | 10-1306563 B1 | 9/2013 |

OTHER PUBLICATIONS

Borsa, D.M., et al., "Growth, structural and optical properties of Cu3N films," Surface Science, 548, 2004, pp. 95-105.

* cited by examiner

【Fig. 1】
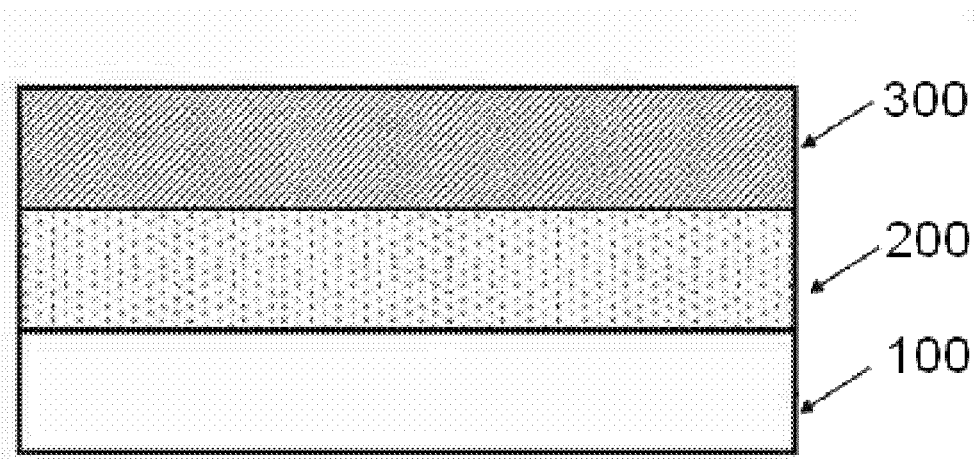
【Fig. 2】
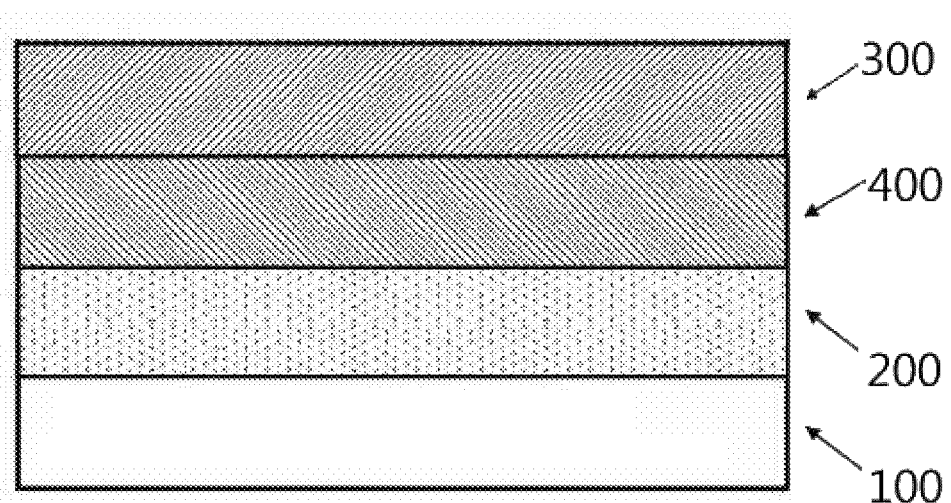
【Fig. 3】
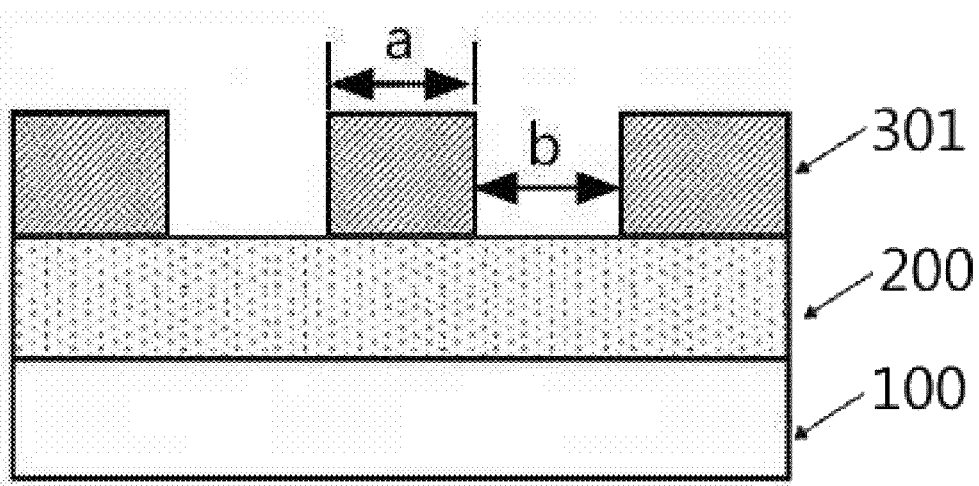

[Fig. 4]
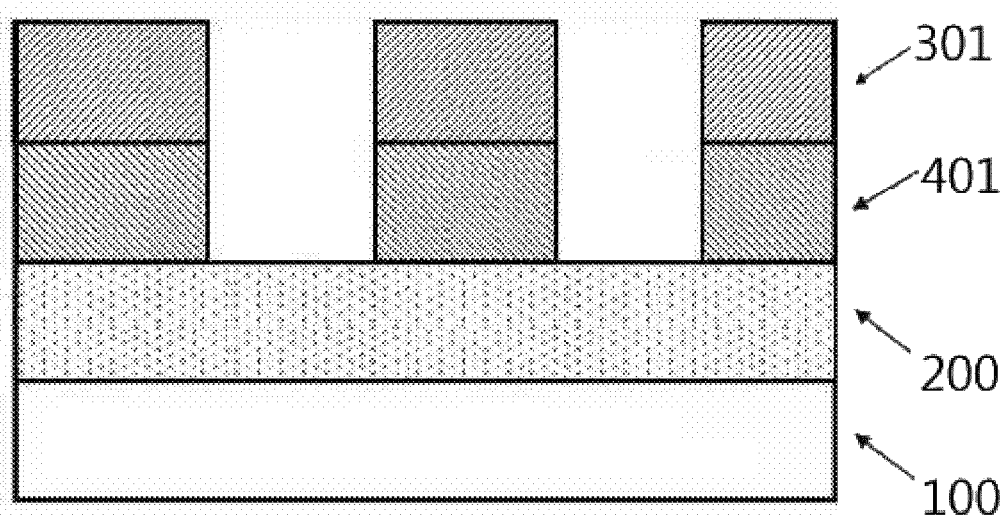

CONDUCTIVE FILM, METHOD FOR MANUFACTURING THE SAME AND DISPLAY DEVICE COMPRISING THE SAME

This application is a National Stage Entry of International Application No. PCT/KR2014/010280, filed Oct. 30, 2014, and claims the benefit of Korean Application No. 10-2013-0129992, filed on Oct. 30, 2013, all of which are hereby incorporated by reference in their entirety for all purposes as if fully set forth herein.

TECHNICAL FIELD

The present disclosure relates to a conductive film, a method for manufacturing the same, and a display device including the same.

BACKGROUND ART

A touch panel is generally divided into as follows depending on the detection methods of signals. In other words, the type includes a resistive type sensing a location pressed by pressure while a direct current voltage is applied through changes in current or voltage values, a capacitive type using capacitance coupling while an alternating current voltage is applied, and an electromagnetic type sensing a location selected while a magnetic field is applied as changes in voltages.

A transparent electrode has been commonly used in a display unit of a touch panel, and a metal such as Ag has been used as a wiring electrode. As demand for a large display has recently increased in touch panels, the width of a bezel has become relatively small in order to have a large display when the size of a touch panel is the same. Accordingly, development of a display unit electrode and a wiring electrode satisfying a small-width bezel size has been required.

PRIOR ART DOCUMENTS

Patent Documents

Korean Patent Application Laid-Open Publication No. 2010-0007605.

DISCLOSURE

Technical Problem

An object of the present application is to provide a conductive film provided with a conductive pattern layer, which is chemically and physically stable while having excellent electrical conductivity and is capable of obtaining a fine line width, on a transparent electrode.

Another object of the present application is to provide a method for manufacturing the conductive film.

Still another object of the present application is to provide a touch panel, a display device or a solar cell in which the conductive film is used.

The object of the present application is not limited to the technological object mentioned above, and another object that has not been mentioned above will be clearly understood by those skilled in the art from the descriptions below.

Technical Solution

One embodiment of the present application provides a conductive film including a substrate; a transparent electrode layer provided on the substrate; and a conductive pattern layer provided on the transparent electrode layer, wherein the conductive pattern layer includes a metal nitride pattern layer including $CuN_x$ ($0 < x \leq 0.1$, x is a mass ratio of N with respect to a mass of Cu).

One embodiment of the present application provides a conductive film including a substrate; a transparent electrode layer provided on the substrate; and a conductive pattern layer provided on the transparent electrode layer, wherein the conductive pattern layer includes a metal nitride pattern layer including $CuN_x$ ($0 < x \leq 0.1$, x is a mass ratio of N with respect to a mass of Cu), and a metal pattern layer including Cu, and the metal pattern layer is provided on at least one surface of the metal nitride pattern layer.

Another embodiment of the present application provides a method for manufacturing a conductive film including preparing a substrate; forming a transparent electrode layer on the substrate; and forming a conductive pattern layer on the transparent electrode layer, wherein the conductive pattern layer includes a metal nitride pattern layer including $CuN_x$ ($0 < x \leq 0.1$, x is a mass ratio of N with respect to a mass of Cu).

Still another embodiment of the present application provides a display device including the conductive film.

Still another embodiment of the present application provides a touch panel including the conductive film.

Still another embodiment of the present application provides a solar cell including the conductive film.

Advantageous Effects

A conductive film according to one embodiment of the present application has an advantage of being chemically and physically stable while having excellent electrical conductivity.

The conductive film according to one embodiment of the present application is capable of obtaining a fine line width, and therefore, is capable of being used as a sensor electrode in a bezel unit of a touch panel, and has an advantage of being used in touch panels, and various display devices or solar cells as well.

DESCRIPTION OF DRAWINGS

FIG. 1 shows a structure of a state forming a conductive layer prior to forming a conductive pattern layer in a conductive film according to one embodiment of the present application.

FIG. 2 shows a structure of a state forming a conductive layer prior to forming a conductive pattern layer in a conductive film according to one embodiment of the present application.

FIG. 3 illustrates a structure of a conductive film according to one embodiment of the present application.

FIG. 4 illustrates a structure of a conductive film according to one embodiment of the present application.

100: Substrate
200: Transparent Electrode Layer
300: Metal Nitride Layer
301: Metal Nitride Pattern Layer
400: Metal Layer
401: Metal Pattern Layer

MODE FOR DISCLOSURE

In the present application, a description of one member being placed "on" another member includes not only a case of the one member adjoining the another member but a case of still another member being present between the two members.

In the present specification, a description of a certain part "including" certain constituents means capable of further including other constituents, and does not exclude other substituents unless particularly stated on the contrary.

Hereinafter, the present application will be described in detail.

One embodiment of the present application provides a conductive film including a substrate; a transparent electrode layer provided on the substrate; and a conductive pattern layer provided on the transparent electrode layer, wherein the conductive pattern layer includes a metal nitride pattern layer including $CuN_x$ (0<x≤0.1, x is a mass ratio of N with respect to a mass of Cu).

According to one embodiment of the present application, the metal nitride pattern layer may be formed with the $CuN_x$ (0<x≤0.1, x is a mass ratio of N with respect to a mass of Cu). Alternatively, the metal nitride pattern layer may include the $CuN_x$ (0<x≤0.1, x is a mass ratio of N with respect to a mass of Cu) as a main component. However, impurities may be included from a manufacturing process.

As the ratio of nitrogen increases in the metal nitride pattern layer and approaches a stoichiometric ratio, there is an advantage in that oxidation resistance is enhanced, however, there is a disadvantage in that etching processability is reduced. Therefore, when the mass ratio of N with respect to the mass of Cu is greater than 0 and less than or equal to 0.1, there is an advantage in that oxidation resistance or corrosion resistance is excellent, and etching processibility for a Cu etchant is also excellent. Specifically, according to one embodiment of the present specification, the content of nitrogen in the $CuN_x$ of the metal nitride pattern layer may be greater than 0% and less than or equal to 10% with respect to the mass of Cu.

According to one embodiment of the present specification, the metal nitride pattern layer may further include oxygen atoms, and the content of the oxygen atoms may be greater than or equal to 3% and less than or equal to 6% with respect to the mass of Cu in the $CuN_x$. According to one embodiment of the present specification, when the metal nitride pattern layer further includes oxygen atoms, it may be a case of including the oxygen atoms as impurities from a manufacturing process, or detecting the oxygen atoms in air during an inspection of the metal nitride pattern layer components.

In the present specification, being "transparent" means having visible light transmittance of 70% or greater or 80% or greater. In addition, a case in which the whole area is not transparent and an aperture ratio is 60% or greater may also be included.

In the present invention, "conductivity" means electrical conductivity.

In the present invention, a "film" is not limited in its thickness, materials and specific forms.

The metal nitride pattern layer including the copper nitride requires very high activation energy in order to decompose the triple bonds of nitrogen molecules and thereby is very chemically stable, and therefore, is effective in preventing corrosion or oxidation. In addition, there is an advantage of having excellent mechanical properties due to very high surface strength.

One embodiment of the present application provides a conductive film including a substrate; a transparent electrode layer provided on the substrate; and a conductive pattern layer provided on the transparent electrode layer, and the conductive pattern layer includes a metal nitride pattern layer including $CuN_x$ (0<x≤0.1, x is a mass ratio of N with respect to a mass of Cu), and a metal pattern layer including Cu, wherein the metal pattern layer is provided on at least one surface of the metal nitride pattern layer.

Specifically, according to one embodiment of the present application, the conductive pattern layer may further include a metal pattern layer including Cu, and the metal pattern layer may be provided on at least one surface of the metal nitride pattern layer.

According to one embodiment of the present application, the metal pattern layer may be formed with Cu. In addition, according to one embodiment of the present application, the metal pattern layer may include Cu as a main component. However, some impurities may be included from a manufacturing process.

According to one embodiment of the present application, the metal pattern layer may be provided between the transparent electrode layer and the metal nitride pattern layer. In addition, according to one embodiment of the present application, the metal nitride pattern layer may be provided between the transparent electrode layer and the metal pattern layer.

The metal nitride pattern layer may play a role of preventing corrosion of the metal pattern layer, and also play a role of preventing an glare effect caused by the metal pattern layer when the conductive film is used in a display unit of an electronic device.

Specifically, the metal nitride pattern layer may have the conductive pattern layer as a single layer, and in this case, electrical conductivity may be secured by forming the layer thickly. In addition, the metal nitride pattern layer is provided on one surface of the metal pattern layer, therefore, may play a role of improving performances of the conductive pattern layer by preventing oxidation of the metal pattern layer without greatly lowering electrical conductivity of the metal pattern layer.

In addition, the metal nitride pattern layer is capable of being etched using the same etchant with the metal pattern layer, therefore, there is also an advantage in that the metal nitride pattern layer and the metal pattern layer may be etched all together. Specifically, the etchant may be a Cu etchant, and Cu etchants generally used in the art may be used without limit.

According to one embodiment of the present application, the metal pattern layer may be provided physically adjoining the metal nitride pattern layer. Specifically, when the metal pattern layer and the metal nitride pattern layer are provided physically adjoining each other, the metal nitride pattern layer prevents the metal pattern layer from being oxidized in a high temperature environment, and the metal pattern layer may maintain excellent electrical conductivity.

According to one embodiment of the present application, the metal pattern layer may be provided on the upper surface of the metal nitride pattern layer. Specifically, when the conductive film is used in a display unit of an electronic device and is recognized from the outside through the substrate, the metal nitride pattern layer may play a role of preventing glare of the metal pattern layer.

According to one embodiment of the present application, the metal nitride pattern layer may be provided on the metal pattern layer. In addition, according to one embodiment of the present application, the metal nitride pattern layer may be provided on at least a part of the upper surface and the side surface of the metal pattern layer. Specifically, when the conductive film is used in a display unit of an electronic device and is recognized from the outside through a surface opposite to the substrate, the metal nitride pattern layer may play a role of preventing glare of the metal pattern layer.

Specifically, the structure of the conductive film may include a structure of substrate/transparent electrode layer/metal nitride pattern layer, a structure of substrate/transparent electrode layer/metal pattern layer/metal nitride pattern layer, a structure of substrate/transparent electrode layer/metal nitride pattern layer/metal pattern layer, and the like.

FIG. 1 to FIG. 4 illustrate structures of a conductive film according to one embodiment of the present application.

FIG. 1 illustrates a case of being arranged in order of a substrate (100), a transparent electrode layer (200) and a metal nitride layer (300), and shows a state prior to being formed into a conductive pattern layer.

FIG. 2 illustrates a case of being arranged in order of a substrate (100), a transparent electrode layer (200), a metal layer (400) and a metal nitride layer (300), and shows a state prior to being formed into a conductive pattern layer.

FIG. 3 illustrates a case of being arranged in order of a substrate (100), a transparent electrode layer (200) and a metal nitride pattern layer (301). In FIG. 3, a means a line width of the pattern, and b means line spacing of the pattern.

FIG. 4 illustrates a case of being arranged in order of a substrate (100), a transparent electrode layer (200), a metal pattern layer (401) and a metal nitride pattern layer (301).

Copper has excellent electrical conductivity and small resistance, therefore, may be used as a wiring electrode on the top of a transparent electrode layer. However, copper has low activation energy and thereby has a very large potential value in order to be reduced to a neutral metal, therefore, is likely to be oxidized by losing electrons. Accordingly, when only a copper layer is present on the top of a transparent electrode layer, the copper layer may be oxidized or corroded causing a problem of a sheet resistance increase in a high temperature high humidity environment. In addition, mechanical properties are poor since adhesive strength for the transparent electrode layer is poor, and surface strength is also low.

In view of the above, the conductive film according to one embodiment of the present application has both a metal pattern layer including copper and a metal nitride pattern layer including copper nitride as a conductive pattern layer, and therefore, may prevent oxidation or corrosion of the metal pattern layer. Accordingly, the conductive pattern layer of the conductive film according to one embodiment of the present application has excellent chemical durability. Furthermore, the conductive pattern layer has excellent adhesive strength for the transparent electrode layer and has increased surface strength, therefore has an advantage of having excellent physical properties.

According to one embodiment of the present application, electrical conductivity may be more superior when the conductive pattern layer further includes the metal pattern layer compared to a case including only the metal nitride pattern layer. In addition, according to one embodiment of the present application, a structure of the metal pattern layer being provided on the top of the transparent electrode layer, and the metal nitride pattern layer being provided on the top of the metal pattern layer is more advantageous in terms of chemical durability.

According to one embodiment of the present application, the conductive pattern layer may have sheet resistance of 0.5 Ω/square or lower. Specifically, according to one embodiment of the present application, the conductive film may have sheet resistance of 0.2 Ω/square. According to one embodiment of the present specification, the sheet resistance of the conductive pattern layer may be in the same range with the sheet resistance of the conductive film.

The conductive film according to the present application may be used in a conductive line of a wiring unit used in a bezel unit of a touch panel sensor or a display device, and the like. With touch sensor modules being enlarged, the width of a bezel unit tends to be narrow, and a conductive pattern layer that is finer and has high conductivity is required. Accordingly, when the sheet resistance of the conductive film or the conductive pattern layer satisfies the above range, an excellent effect may be obtained when the conductive film is used in a device.

According to one embodiment of the present application, the conductive film may exhibit changes of less than 20% in the sheet resistance value even when 7 or more days pass by under a condition of a temperature of 85° C. or higher and relative humidity of 85% or higher. More specifically, the sheet resistance value may change in 15% or less under the above-mentioned condition.

Specifically, according to one embodiment of the present application, the conductive pattern layer may have $R/R_0$ of 1.2 or less, and more specifically have $R/R_0$ of 1.15 or less. Herein, $R_0$ is an initial sheet resistance value at a temperature of 85° C. and relative humidity of 85%, and R is a sheet resistance value after 7 or more days pass by at a temperature of 85° C. and relative humidity of 85%.

Specifically, according to one embodiment of the present application, the conductive film and/or the conductive pattern layer may not have significantly changed sheet resistance value despite a condition in which 7 or more days pass by at a temperature of 85° C. and relative humidity of 85%. This may apply to a case in which the metal pattern layer is formed with only a metal nitride pattern layer, or the metal pattern layer includes both a metal nitride pattern layer and a metal pattern layer. Furthermore, when the metal pattern layer includes both a metal nitride pattern layer and a metal pattern layer, the metal nitride pattern layer prevents oxidation of the metal pattern layer, and may minimize a decrease in the sheet resistance value of the metal pattern layer.

According to one embodiment of the present application, when the conductive pattern layer includes the metal nitride pattern layer and the metal pattern layer, the conductive pattern layer may have a sheet resistance increase rate of 10% or less when 30 minutes passes by under an atmosphere of 150° C. Specifically, such a condition may be identical to a process of crystallizing a transparent electrode layer when the transparent electrode layer is an ITO film, and the metal pattern layer under such a condition may have a sheet resistance value that does not significantly decrease since oxidation is suppressed by the metal nitride pattern layer.

According to one embodiment of the present application, the metal nitride pattern layer may have a thickness of greater than or equal to 20 nm and less than or equal to 160 nm. Specifically, according to one embodiment of the present application, when the conductive pattern layer includes only the metal nitride pattern layer, the metal nitride pattern layer may have a thickness of 60 nm or greater and specifically 80 nm or greater in order to secure conductivity.

According to one embodiment of the present application, the thickness of the metal nitride pattern layer may not include the metal pattern layer. According to one embodiment of the present application, when the conductive film has a sheet resistance value of 0.5 Ω/square or less, the metal nitride pattern layer having a thickness of greater than or equal to 60 nm and less than or equal to 160 nm is preferable in that an optimal level of sheet resistance properties may be secured, and optical properties may be secured in a visible light region. In addition, according to one embodiment of the present application, when the conductive film has a sheet resistance value of 0.4 Ω/square, the metal nitride pattern layer having a thickness of greater than or equal to 80 nm and less than or equal to 120 nm is more preferable in securing optical properties and resistance properties.

Furthermore, according to one embodiment of the present application, when the conductive pattern layer includes the metal nitride pattern layer and the metal pattern layer, the metal nitride pattern layer may have a thickness of greater than or equal to 20 nm and less than or equal to 80 nm. This is due to the fact that the conductivity of the metal pattern layer is higher than the conductivity of the metal nitride pattern layer, and therefore, the metal nitride pattern layer has a bigger role of securing corrosion resistance of the metal pattern layer than securing conductivity.

According to one embodiment of the present application, the thickness ratio of the metal pattern layer and the metal nitride pattern layer may be greater than or equal to 1:0.2 and less than or equal to 1:0.5.

According to one embodiment of the present application, the metal pattern layer may have a thickness of 100 nm or greater, and more specifically 150 nm or greater. In addition, according to one embodiment of the present application, the metal pattern layer may have a thickness of 500 nm or less and more specifically 200 nm or less. Electrical conductivity of the metal pattern layer is dependent on the thickness, therefore, when the thickness is very small, a problem of a specific resistance value increase may occur since a continuous thickness is not formed. Accordingly, a thickness of 100 nm or greater is preferable. In addition, when the conductive film is used for a narrow bezel of a touch panel and the like, the thickness of the metal pattern layer is preferably 100 nm or greater.

According to one embodiment of the present application, when the metal nitride pattern layer has a thickness of 20 nm or greater, it is effective in preventing corrosion of the metal pattern layer, and a conductive pattern layer having uniform line width and thickness is readily formed. In addition, when the metal nitride pattern layer has a thickness of 80 nm or less and specifically 50 nm or less, the conductive film has excellent light transmittance, and electrical properties of the conductive pattern layer may also be secured.

According to one embodiment of the present application, the conductive pattern layer including the metal pattern layer and/or the metal nitride pattern layer may be obtained with a fine line width pattern, therefore, has an advantage of increasing an aperture ratio of the conductive film.

According to one embodiment of the present application, the conductive film may have an aperture ratio of 70% or greater and more specifically 80% or greater, and less than 100%. The aperture ratio may mean a percentage value of a region excluding the conductive pattern layer with respect to the total area of one surface of the transparent electrode layer provided with the conductive pattern layer.

According to one embodiment of the present application, the conductive film may have transmittance of 70% or greater, 80% or greater or 90% or greater, or 92% or greater in a visible light region. The conductive film may have a haze value of 6% or less, 5% or less, or 4% or less.

According to one embodiment of the present application, the conductive pattern layer may have a pattern line width of 0.1 μm or greater, more specifically 10 μm or greater, and even more specifically 20 μm or greater. In addition, according to one embodiment of the present application, the conductive pattern layer may have a pattern line width of 100 μm or less and more specifically 30 μm or less.

When the pattern line width of the conductive pattern layer is less than 0.1 μm, the pattern may be difficult to be obtained, and when greater than 100 μm, increasing the number of channels to be used in a bezel unit having a narrow width, or to make a high-resolution display is difficult. The conductive pattern layer having a pattern line width of 30 μm or less is advantageous in obtaining a display having a large area and high resolution since the number of channels may be increased in a narrow bezel unit.

According to one embodiment of the present application, the conductive pattern layer may have pattern line spacing of 0.1 μm or greater, more specifically 10 μm or greater, and even more specifically 20 μm or greater. In addition, according to one embodiment of the present application, the conductive pattern layer may have pattern line spacing of 100 μm or less, and more specifically 30 μm or less.

In the present invention, the "pattern line spacing" means spacing between patterns. Specifically, it may mean spacing between the lines forming patterns. The part expressed as b in FIG. 3 illustrates the pattern line spacing.

According to one embodiment of the present application, the line widths of the metal pattern layer and the metal nitride pattern layer in the conductive pattern layer may not necessarily be completely the same, and cases in which the pattern line width of the metal pattern layer is larger or smaller than the pattern line width of the metal nitride pattern layer are also included in the scope of the present application.

Specifically, according to one embodiment of the present application, the metal pattern layer is provided on the upper surface or on the lower surface of the metal nitride pattern layer, and the pattern line width of the metal pattern layer may be from 80% to 120% with respect to the pattern line width of the metal nitride.

According to one embodiment of the present application, the metal pattern layer is provided on the upper surface or on the lower surface of the metal nitride pattern layer, and the pattern line width formed by the metal nitride pattern layer may be the same as or larger than the pattern line width of the metal pattern layer. When the pattern line width of the metal nitride pattern layer is the same as or larger than the pattern line width of the metal pattern layer, an effect of preventing oxidation or corrosion of the metal pattern layer may be enhanced. In addition, when the pattern line width of the metal nitride pattern layer is the same as or larger than the pattern line width of the metal pattern layer, an effect of preventing an glare effect caused by the metal pattern layer may be obtained.

In one embodiment of the present application, the conductive pattern layer may form a regular pattern or an irregular pattern. Specifically, the conductive pattern layer may be provided on the transparent electrode while forming a pattern through a patterning process of the conductive layer.

Specifically, the pattern may have a form of a polygon such as a triangle and a quadrangle, a circle, an ellipse or amorphousness. The triangle may include an equilateral triangle, a right-angled triangle or the like, and the quadrangle may include a square, a rectangle, a trapezoid or the like.

As the regular pattern, pattern forms used in the art such as a mesh pattern may be used. The irregular pattern is not particularly limited, and may have a boundary line form of figures forming a voronoi diagram. When the irregular pattern is used in the present application, a diffraction pattern of reflected light due to illumination having directivity may be removed by the irregular pattern, and influences due to light scattering may be minimized by the metal nitride pattern layer, therefore, problems in visibility may be minimized.

According to one embodiment of the present application, the transparent electrode layer may have a thickness of 100 nm or greater and more specifically 150 nm or greater. In addition, according to one embodiment of the present application, the transparent electrode layer may have a thickness of 500 nm or less and more specifically 200 nm or less. Electrical conductivity of the transparent electrode layer is dependent on the thickness, therefore, when the thickness is very small, a problem of a specific resistance value increase may occur since a continuous thickness is not formed. Accordingly, a thickness of 100 nm or greater is preferable. In addition, when the conductive film is used for a narrow bezel of a touch panel and the like, the thickness of the transparent electrode layer is preferably 100 nm or greater.

According to one embodiment of the present application, the transparent electrode layer may include a metal oxide or a conductive polymer.

According to one embodiment of the present application, the metal oxide may be selected from the group consisting of indium tin oxide (ITO), indium gallium zinc oxide (IGZO), zinc oxide doped with gallium (GZO), zinc oxide doped with indium (IZO) and zinc oxide doped with aluminum (AZO), and the conductive polymer may be PEDOT:PSS.

According to one embodiment of the present application, the substrate may be any substrate as long as it is a transparent substrate, and examples thereof may include glass or polyethylene terephthalate (PET), polycarbonate (PC) or polyamide (PA).

According to one embodiment of the present application, the conductive pattern layer may be wiring for a bezel of a display device. Specifically, the conductive film may be used as an electrode of a display device, and the region including the conductive pattern layer may be a wiring unit of a bezel region of the display.

According to one embodiment of the present application, the conductive film may be used for a sensor electrode of a touch panel. The touch panel may all include a resistive type, a capacitive type and an electromagnetic type.

One embodiment of the present application provides a method for manufacturing the conductive film.

Specifically, one embodiment of the present application provides a method for manufacturing a conductive film including preparing a substrate; forming a transparent electrode layer on the substrate; and forming a conductive pattern layer on the transparent electrode layer, wherein the conductive pattern layer includes a metal nitride pattern layer including CuNx (0<x≤0.1, x is a mass ratio of N with respect to a mass of Cu).

According to one embodiment of the present application, the step of forming a conductive pattern layer may include forming a metal nitride pattern layer including CuNx (0<x≤0.1, x is a mass ratio of N with respect to a mass of Cu) on the transparent electrode layer.

According to one embodiment of the present application, the step of forming a conductive pattern layer may include forming a metal pattern layer including Cu on at least one surface of the metal nitride pattern layer.

According to one embodiment of the present application, the step of forming a metal nitride pattern layer may be carried out by forming a metal nitride layer using an evaporation method and patterning the result.

According to one embodiment of the present application, the step of forming a metal nitride layer may be carried out by evaporating Cu using a source metal under $N_2$ atmosphere.

According to one embodiment of the present application, when the metal nitride layer is formed using the evaporation, the mass ratio of Cu and N in the metal nitride layer may be as shown in the following Table 1.

TABLE 1

| $N_2$ Partial Pressure | N Content | Cu Content | N/Cu (%) |
|---|---|---|---|
| 15 | 4.8 | 89.9 | 5.34 |
| 40 | 7.2 | 87.5 | 8.23 |
| 60 | 7.7 | 87.3 | 8.82 |
| 80 | 7.9 | 88.3 | 8.95 |
| 100 | 7.9 | 89.3 | 8.85 |

In the results of Table 1, some impurities such as oxygen may be further included besides N and Cu from the process, however, this does not affect the performances of the metal nitride pattern layer.

In the manufacturing method according to one embodiment of the present application, the conductive pattern layer may further include a metal layer including Cu provided on the upper surface or on the lower surface of the metal nitride layer.

According to one embodiment of the present application, the step of forming the conductive pattern layer may further include a step of forming a metal pattern layer including Cu on the upper surface or on the lower surface of the metal nitride layer.

According to one embodiment of the present application, the step of forming a conductive pattern layer may include forming a conductive layer including a metal nitride layer including CuNx (0<x≤0.1, x is a mass ratio of N with respect to a mass of Cu) on the transparent electrode layer, and then patterning the conductive layer.

According to one embodiment of the present application, the step of forming a conductive layer may be carried out by forming the metal nitride layer on the transparent electrode layer, and then forming a metal pattern layer including Cu on the metal nitride layer. In addition, according to one embodiment of the present application, the step of forming a conductive layer may be carried out by forming a metal layer including Cu on the transparent electrode layer, and then forming the metal nitride layer on the metal layer.

According to one embodiment of the present application, the step of patterning the conductive layer may be carried out by patterning the metal nitride layer and the metal layer at the same time.

Specifically, the step of patterning the conductive layer may be carried out by etching the metal nitride layer and the metal layer all together using an etching liquid. Specifically, the etching of the metal nitride layer and the metal layer carried out together may use a Cu etchant.

The test results of etching the metal nitride layer having a thickness of 50 nm and 100 nm for a Cu etchant of a nitrogen base under an atmosphere of 40° C. are as shown in the following Table 2.

TABLE 2

| N/Cu (%) | 50 nm | 100 nm |
|---|---|---|
| 5.34 | 7 sec | 10 sec |
| 8.23 | 9 sec | 13 sec |
| 8.82 | 9 sec | 13 sec |
| 8.95 | 20 sec | 23 sec |
| 8.85 | 20 sec | 24 sec |

As seen from the results of Table 2, the metal nitride layer may be etched by a Cu etchant, therefore, may be etched all together with the metal layer having Cu as a main component.

In the step of forming a conductive layer, the method of forming the metal nitride layer and/or the metal layer may use methods well known in the art. For example, methods such as evaporation, sputtering, wet coating, vaporization, electroplating or electroless plating and metal foil lamination may be used for the formation, and specifically, an evaporation method may be used for the formation.

The method of forming the metal nitride pattern layer and/or the metal pattern layer is not particularly limited, and for example, a method of directly printing a pattern layer may be used. When a printing method is used, an ink or a paste of a conductive material may be used, and the paste may further include a binder resin, a solvent, a glass frit and the like in addition to the conductive material.

Patterning of the conductive layer may use a material having an etching resist property. The etching resist may form a resist pattern using a printing method, a photolithography method, a photography method, a dry film resist method, a wet resist method, a method using a mask or laser transfer, for example, thermal transfer imaging, and the like, and a dry film resist method is more preferable, however, the method is not limited thereto. The conductive layer may be etched and patterned using the etching resist pattern, and the etching resist pattern may be readily removed using a strip process.

According to one embodiment of the present application, the step of patterning a conductive layer may be carried out using a chemical etching method. Specifically, the conductive layer may be etched using an etching resist and an etching liquid on the conductive layer. Furthermore, when the conductive layer is etched using the chemical etching method, the metal nitride layer, which has stronger corrosion resistance than the metal layer, has a lower etching rate compared to the metal layer. Therefore, the pattern line width of the metal nitride pattern layer may be larger than the pattern line width of the metal pattern layer, and this may prevent visibility decline caused by the metal pattern layer.

One embodiment of the present application provides a touch panel including the conductive film. The conductive film may be used as a sensor electrode of a bezel unit in the touch panel. The touch panel may all include a resistive type, a capacitive type and an electromagnetic type.

One embodiment of the present application provides a display device including the conductive film.

The touch panel according to one embodiment of the present application may further include an additional conductive film besides the conductive film described above. In this case, the two conductive films may be arranged in the same direction, or the two conductive films may be arranged in the opposite direction to each other. The two or more conductive films capable of being included in the touch panel of the present application do not necessarily have the same structure. In addition, the layer lamination structures in the two or more conductive films may be different from each other. When the two or more conductive films are included, an insulation layer may be provided therebetween. Herein, the insulation layer may additionally have a function of an adhesion layer.

The touch panel according to one embodiment of the present application may include a lower substrate; an upper substrate; and an electrode layer provided on any one or both sides of the surface of the lower substrate adjoining the upper substrate and the surface of the upper substrate adjoining the lower substrate. The electrode layers may each have a function of X axis location detection and Y axis location detection.

Herein, one or both of the electrode layer provided on the lower substrate and the surface of the lower substrate adjoining the upper substrate; and the electrode layer provided on the upper substrate and the surface of the upper substrate adjoining the lower substrate may be the conductive film according to one embodiment of the present application described above. When only one of the electrode layers is the conductive film according to the present application, the other may have a conductive pattern known in the art.

When two electrode layers are formed by providing electrode layers on one surface of both the upper substrate and the lower substrate, an insulation layer or a spacer may be provided between the lower substrate and the upper substrate so that a constant distance is maintained between the electrode layers and connection does not occur. The insulation layer may include an adhesive or a UV or heat curable resin. The touch panel may further include a ground connection unit connected to the pattern of the metal nitride pattern layer in the conductive film described above. For example, the ground connection unit may be formed on the edge portion of a surface on which the pattern of the metal nitride pattern layer of the substrate is formed. In addition, at least one of an anti-reflection film, a polarizing film, a fingerprint resistance film may be provided on at least one surface of a laminate including the conductive film. Other types of functional films may be further included besides the functional films described above depending on design specifications. Such a touch panel may be used in a display device such as an OLED display panel, a liquid crystal display (LCD), a cathode-ray tube (CRT) or a plasma display panel (PDP).

The touch panel according to one embodiment of the present application may additionally include an electrode unit or a pad unit on the conductive film.

One embodiment of the present application provides a display device including the conductive structure. In the display device, the conductive film according to one embodiment of the present application may be used in a color filter substrate, a thin-film transistor substrate or the like.

One embodiment of the present application provides a solar cell including the conductive film. For example, the solar cell may include an anode electrode, a cathode electrode, a photoactive layer, a hole transfer layer and/or an electron transfer layer, and the conductive film according to one embodiment of the present application may be used as the anode electrode and/or the cathode electrode.

The conductive film may substitute an existing ITO in a display device or a solar cell, and may have a potential application in flexible products. In addition, the conductive film may be used as a next-generation transparent electrode together with a CNT, a conductive polymer, graphene and the like.

Hereinafter, the present application will be described in detail with reference to examples and comparative examples in order to specifically describe the present application. However, examples according to the present application may be modified to various other forms, and the scope of the present application is not interpreted to be limited to examples described below. Examples of the present application are provided in order to more completely describe the present application to those having average knowledge in the art.

Example 1

An ITO film having a thickness of 100 nm was deposited on a PET substrate, a metal layer was formed thereon to 100 nm with Cu at an eutectic pressure of 5 m torr using an R2R sputter, and a metal nitride layer of CuNx (x<0.1) was formed to 20 nm. After that, the metal layer and the metal nitride layer were etched all together using a Cu etchant, and as a result, a conductive film provided with a conductive pattern layer was manufactured on the ITO film.

Herein, the sheet resistance of the conductive pattern layer was measured to be 0.25 Ω/square or less.

Comparative Example 1

An ITO film having a thickness of 100 nm was deposited on a PET substrate, a metal layer was formed thereon to 100 nm with Cu at an eutectic pressure of 5 m torr using an R2R sputter, and the metal layer was etched as in Example 1 to manufacture a conductive film provided with a conductive pattern layer.

Test Example 1

Sheet resistance of the conductive pattern layer of the conductive film according to Example 1 and Comparative Example 1 was normalized to 1, and changes in the sheet resistance value of the conductive pattern layer depending on time were measured after setting a condition to a temperature of 85° C. and relative humidity of 85%. Then, the results are shown in the following Table 3.

TABLE 3

| Time (hr) | Cu | CuNx (x < 0.1) |
|---|---|---|
| 0 | 1 | 1 |
| 24 | 1.136 | — |
| 48 | 1.114 | |
| 72 | 1.153 | |
| 144 | 1.203 | |
| 168 | 1.216 | |
| 192 | 1.322 | |
| 210 | 1.335 | 1.121 |

As seen from the results in Table 3, it was identified that the conductive pattern layer of Example 1 had mere changes of 12.1% in the sheet resistance value after 9 days passed by even under a condition of high temperature and high humidity, however, the conductive pattern layer of Comparative Example 1 had changes of greater than 20% in the sheet resistance value from after 6 days passed by.

The examples of the present application have been described with reference to accompanying drawings, however, the present application is not limited to the above-described examples, and may be prepared to various other forms, and those skilled in the art will appreciate that the present application may be implemented in other specific forms without departing from technical ideas and essential characteristics of the present application. Therefore, it is to be understood that the examples described above are for illustrative purposes only and are not limitative.

The invention claimed is:

1. A conductive film comprising:
   a substrate;
   a transparent electrode layer provided on the substrate; and
   a conductive pattern layer provided on the transparent electrode layer,
   wherein the conductive pattern layer includes a metal nitride pattern layer including CuNx, x is a mass ratio of N with respect to a mass of Cu, and 0<x≤0.1, and
   wherein a thickness of the metal nitride pattern layer is greater than or equal to 20 nm and less than or equal to 160 nm.

2. The conductive film of claim 1, wherein the conductive pattern layer further includes a metal pattern layer including Cu, and the metal pattern layer is provided on at least one surface of the metal nitride pattern layer.

3. The conductive film of claim 2, wherein the metal pattern layer is provided between the transparent electrode layer and the metal nitride pattern layer.

4. The conductive film of claim 2, wherein the metal nitride pattern layer is provided between the transparent electrode layer and the metal pattern layer.

5. The conductive film of claim 2, wherein the conductive pattern layer has a sheet resistance increase rate of 10% or less when 30 minutes passes by under an atmosphere of 150° C.

6. The conductive film of claim 2, wherein a thickness ratio of the metal pattern layer and the metal nitride pattern layer is greater than or equal to 1:0.2 and less than or equal to 1:0.5.

7. The conductive film of claim 2, wherein the metal pattern layer has a thickness of 100 nm or greater.

8. The conductive film of claim 2, wherein the metal pattern layer is provided on an upper surface or on a lower surface of the metal nitride pattern layer, and a pattern line width of the metal pattern layer is from 80% to 120% with respect to a pattern line width of the metal nitride pattern layer.

9. The conductive film of claim 1, wherein the metal nitride pattern layer further includes oxygen atoms, and a content of the oxygen atoms is greater than or equal to 3% and less than or equal to 6% with respect to the mass of Cu in the CuNx.

10. The conductive film of claim 1, wherein the conductive pattern layer has sheet resistance of 0.5 Ω/square or less.

11. The conductive film of claim 1, wherein the conductive pattern layer has R/R0 of 1.2 or less, wherein
   R0 is an initial sheet resistance value at a temperature of 85° C. and relative humidity of 85%, and R is a sheet resistance value after 7 or more days pass by at a temperature of 85° C. and relative humidity of 85%.

12. The conductive film of claim 1, wherein the conductive pattern layer has a pattern line width of greater than or equal to 0.1 μm and less than or equal to 100 μm.

13. The conductive film of claim 1, wherein the conductive pattern layer has pattern line spacing of greater than or equal to 0.1 μm and less than or equal to 100 μm.

14. The conductive film of claim 1, wherein the transparent electrode layer includes a metal oxide or a conductive polymer.

15. The conductive film of claim 1, wherein the conductive pattern layer is wiring for a bezel of a display device.

16. A display device comprising the conductive film of claim 1.

17. A touch panel comprising the conductive film of claim 1.

18. A solar cell comprising the conductive film of claim 1.

19. The conductive film of claim 1, wherein the thickness of the metal nitride pattern layer is greater than or equal to 80 nm and less than or equal to 120 nm.

20. A method for manufacturing a conductive film comprising:
preparing a substrate;
forming a transparent electrode layer on the substrate; and
forming a conductive pattern layer on the transparent electrode layer,
wherein the conductive pattern layer includes a metal nitride pattern layer including CuNx, x is a mass ratio of N with respect to a mass of Cu, and $0 < x \leq 0.1$.

21. The method for manufacturing a conductive film of claim 20, wherein the step of forming a conductive pattern layer includes forming a metal pattern layer including Cu on at least one surface of the metal nitride pattern layer.

22. The method for manufacturing a conductive film of claim 20, wherein the step of forming a conductive pattern layer includes forming a conductive layer including a metal nitride layer including CuNx, wherein x is a mass ratio of N with respect to a mass of Cu, and $0 < x \leq 0.1$, on the transparent electrode layer, and then patterning the conductive layer.

23. The method for manufacturing a conductive film of claim 22, wherein the conductive layer further includes a metal layer including Cu provided on an upper surface or on a lower surface of the metal nitride layer.

24. The method for manufacturing a conductive film of claim 23, wherein the step of patterning the conductive layer is carried out by patterning the metal nitride layer and the metal layer at the same time.

25. The method for manufacturing a conductive film of claim 24, wherein the step of patterning the conductive layer is carried out by etching the metal nitride layer and the metal layer all together using an etching liquid.

* * * * *